(12) United States Patent
Wang et al.

(10) Patent No.: US 10,910,293 B1
(45) Date of Patent: Feb. 2, 2021

(54) LEADFRAME WITH DIE PAD HAVING CANTILEVERS TO SECURE ELECTRONIC COMPONENT

(71) Applicant: Texas Instruments Incorporated, Dallas, TX (US)

(72) Inventors: ChienHao Wang, Taipei (TW); Bob Lee, New Taipei (TW); YuhHarng Chien, Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/665,459

(22) Filed: Oct. 28, 2019

(51) Int. Cl.
  *H01L 23/495* (2006.01)
  *H01L 23/50* (2006.01)
  *H01L 23/00* (2006.01)

(52) U.S. Cl.
  CPC .. *H01L 23/49503* (2013.01); *H01L 23/49551* (2013.01); *H01L 23/50* (2013.01); *H01L 24/85* (2013.01); *H01L 24/48* (2013.01); *H01L 2224/48177* (2013.01)

(58) Field of Classification Search
  CPC ......... H01L 23/49503; H01L 23/49551; H01L 23/50; H01L 24/85; H01L 24/48; H01L 2224/48177
  See application file for complete search history.

(56) References Cited

U.S. PATENT DOCUMENTS

| 7,964,949 | B2 | 6/2011 | Lai et al. | |
| 8,072,047 | B2 * | 12/2011 | Camacho | ............ H01L 23/4334 |
| | | | | 257/659 |
| 9,728,491 | B2 * | 8/2017 | Cruz | ................. H01L 23/49503 |
| 2009/0096077 | A1 | 4/2009 | Lai et al. | |

* cited by examiner

*Primary Examiner* — Peniel M Gumedzoe
(74) *Attorney, Agent, or Firm* — Ronald O. Neerings; Charles A. Brill; Frank D. Cimino (57) ABSTRACT

A leadframe includes a die pad having a plurality of sides which collectively define the rectangular die pad area including at least two securing sides that include a linear portion with a cantilever interrupting the linear portion. The die pad has a top surface defining a top plane and a bottom surface defining a bottom plane. Lead terminals are beyond the die pad. The cantilevers have a fixed end and a free end opposite the fixed ends that enables flexing or bending responsive to a received force. The free ends include a distal end with an electronic component locking feature. The fixed ends are positioned beyond the die pad area, and the electronic component locking feature extends inward over the rectangular die pad area for providing mechanical support and for securing the electronic component.

21 Claims, 5 Drawing Sheets

LEADFRAME WITH DIE PAD HAVING CANTILEVERS TO SECURE ELECTRONIC COMPONENT

FIELD

This Disclosure relates to a leadframe for semiconductor packaged devices with a die pad that has a mechanical electronic component securing feature.

BACKGROUND

A variety of semiconductor chip packages are known that provide support for an integrated circuit chip (IC) or die and associated bond wires, provide protection from the environment, and enable surface mounting of the die to and interconnection with a printed circuit board (PCB). One conventional package configuration includes a leadframe having a die pad and wire bond pads, where the die is attached to the die pad with its top side up.

A semiconductor die is generally attached after a pick and place operation with its back side down on the die pad using die attach material. Commonly an epoxy base material is used as the die attach material. The epoxy base die attach material processing involves dispensing, and then curing for achieving cross-linking of the epoxy. A die attach film (DAF) is an alternative solution for die attachment that avoids die attach dispensing and curing. A DAF is laminated on the back side of a wafer so that no dispensing or curing process is needed.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include an electronic component locking leadframe having cantilevers on at least two of the four sides of a die pad, referred to herein as 'securing sides' that provide mechanical securing for an electronic component. The securing sides include a conventional linear portion and at least one cantilever which interrupts the linear portion. The four sides collectively define a conventional rectangular die pad area. The die pad has a top surface defining a top plane and a bottom surface defining a bottom plane. A cantilever is well-known in the art of micro-electromechanical system (MEMS) sensing and as used herein to be a type of beam constrained at one end referred to as a fixed end, with the other end being a free end that enables flexing or bending responsive to a received force.

The free ends of the cantilevers have a distal end with an electronic component locking feature. The electronic component locking feature can include a planar end, or include a protruding sloped top portion and a lower portion indented relative to the top portion that is generally planar and perpendicular to the top plane and to the bottom plane. The fixed end is positioned beyond the rectangular die pad area and the electronic component locking feature extends inward over the rectangular die pad area for providing mechanical support and for the securing of an electronic component. The cantilevers collectively act as a support holder for the electronic component so that no die attach material is needed for securing the electronic component. The electronic component can comprise a semiconductor die that that is generally an integrated circuit (IC) die or a discrete electronic laminate component, such as a laminate inductor, laminate transformer, or a laminate capacitor. A disclosed die pad can also be configured to mechanically secure two or more electronic components that can be positioned laterally or vertically relative to one another.

The electronic component is first placed (e.g., such as using a standard automated die placement apparatus) on the die pad including over the distal ends of the cantilevers which are raised above the top plane of the die pad before the placing of the electronic component. The raised distal ends may be provided by a punch forming process used to form the cantilevers. The electronic component initially pushes the distal end of the respective cantilevers downward from above the top plane of the die pad downward to below the bottom plane of the die pad.

After the distal end of the cantilevers are initially pushed down to below the bottom plane of the die pad, due to the elasticity feature of the cantilever material which generally comprise a thin metal such as comprising copper (generally the leadframe material itself), the cantilever's free end provides an elastic response where the distal end springs back to above the top plane of the die pad. The distal end of the cantilever comes to rest with the electronic component locking feature mechanically holding the electronic component from all of its sides. In the case of the electronic component locking feature including a protruding sloped top portion and a lower portion indented relative to the top portion, the holding includes on the top edges and the edge of the top surface of the electronic component. The lower portion may come to rest on a top side edge of the electronic component die. The thin metal for the cantilevers may be copper-based (copper or a copper alloy) that can be plated, and generally being formed from the leadframe may have a conventional leadframe thickness of about 0.33 mm to 0.85 mm.

Disclose aspects include a leadframe including a die pad having a plurality of sides which collectively define a rectangular die pad area including at least two securing sides that include a linear portion with a cantilever interrupting the linear portion. The die pad has a top surface defining a top plane and a bottom surface defining a bottom plane. Lead terminals are beyond the die pad. The cantilevers have a fixed end and a free end opposite the fixed ends that enables flexing or bending responsive to a received force. The free ends include a distal end with an electronic component locking feature. The fixed ends are positioned beyond the die pad area, and the electronic component locking feature extends inward over the rectangular die pad area for providing mechanical support and for securing the electronic component.

Die attach material, as well as the dispensing and curing processes can all be removed when using a disclosed leadframe with a die pad having cantilevers with a free end and an electronic component locking feature. Accordingly, disclosed leadframes with a die pad having cantilevers utilized to secure an electronic component can shorten the package assembly cycle time, and reduce the material cost for package assembly.

BRIEF DESCRIPTION OF THE DRAWINGS

Reference will now be made to the accompanying drawings, which are not necessarily drawn to scale, wherein.

DETAILED DESCRIPTION

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

Figure 1:
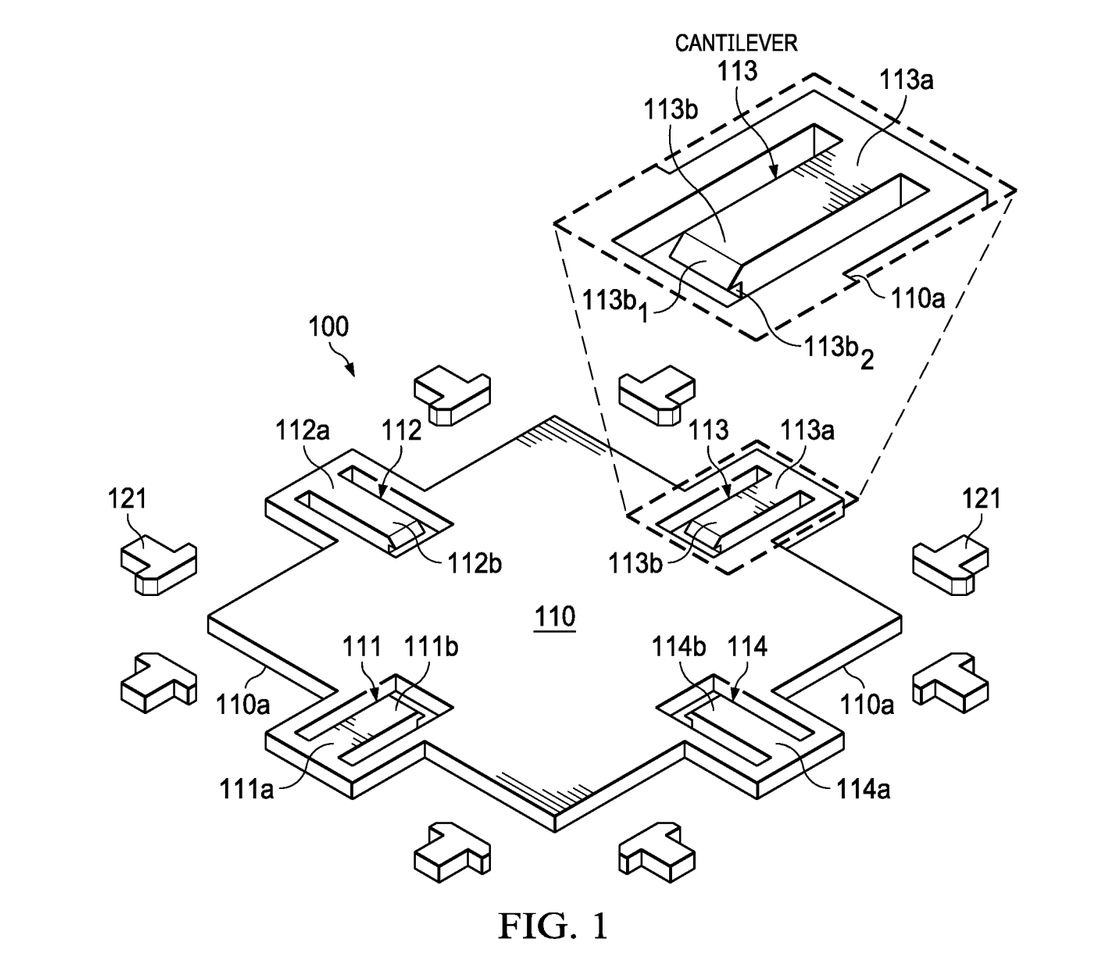
FIG. 1 is a top perspective view of an example die pad that includes cantilevers having a distal end of a free end with an electronic component locking feature including a protruding sloped top portion and a lower portion indented relative to the top portion on all four sides, according to an example aspect.

FIG. 1 is a top perspective view of an example leadframe 100 that includes a die pad 110 with cantilevers 111, 112, 113, 114 on each of its four sides, and lead terminals 121 outside the die pad 110 on each of its sides. The sides of the die pad 110 are shown each including a conventional linear portion 110a that can be seen to collectively define a rectangular die pad area. The die pad 110 has a top plane defining a top surface and a bottom plane defining a bottom surface. The top plane is configured for receiving an electronic component that is generally an IC die or a laminate component, such as a laminate inductor, a laminate transformer, or a laminate capacitor, and the linear portions 110a are each interrupted by a cantilever 111-114. Although all four sides are shown including one cantilever, in some embodiments only two sides of the die pad include cantilevers (see FIG. 5C described below), and in some embodiments the sides can include two or more cantilevers.

The cantilevers 111, 112, 113, 114 have a fixed end 111a-114a with its opposite end being a free end 111b-114b that enables flexing or bending responsive to a received force. The free ends 111b-114b have a distal end with an electronic component locking feature shown in the blow-up view provided of the cantilever 113 in FIG. 1 including a protruding sloped top portion 113$b_1$ and a lower portion 113$b_2$ indented relative to the top portion 113$b_1$. The lower portions such as lower portion 113$b_2$ are generally planar and have a surface that is perpendicular to the top plane and the bottom plane. The fixed ends of the cantilevers 111-114 shown in FIG. 1 can be seen to extend laterally beyond the area of the die pad 110, and the electronic component locking feature provided by virtue of its extending laterally inward over the area of the die pad 110 provides mechanical support and securing for the electronic component. As a result, there is no die attach material needed for securing an electronic component to the die pad 110.

In another disclosed aspect, the electronic component locking feature on the distal end of the cantilevers can be provided generally planar throughout, thus without the sloped top portions shown in FIG. 1. In this arrangement, after placement of the electronic component on the die pad, a tool can be used to bend the cantilevers back down sufficient for an electronic component to pass by the outer edge of the cantilever to enable mechanically locking to a surface resembling the lower portion shown in FIG. 1.

The fixed ends of the cantilevers can be positioned beyond (outward of) the rectangular die pad area by a distance of 1 mm to 3 mm. This distance does not change after bending the cantilevers upwards. Generally, this distance may vary based on different packages such as quad flat pack (QFP) or small outline integrated circuit (SOIC) that generally do not share the same distance. For example, if the die pad has dimensions around 4 mm by 4 mm, the distance the fixed ends extend beyond the rectangular die pad area may be 1 mm to 3 mm. The electronic component locking feature generally extends inward over the rectangular die pad area by a distance of 0.1 mm to 1 mm to enable the distal end to pass the sidewall of the electronic component to reach a position to secure it.

The taller the electronic component or the package, the longer the cantilevers 111-114 are generally designed to be. There is generally no calibration needed for the height of the cantilevers after the cantilevers are bent upward because the cantilever dimensions including the cantilever length are generally custom-designed based on the dimensions of the electronic component including its area and height.

The leadframe 100 is shown with the cantilevers 111-114 being planar with respect to the plane of the leadframe 100. However, there is generally an extra step performed to the die pad 110 of the leadframe 100 before electronic component attachment to result in the distal end of the free end 111b-114b of the cantilevers 111-114 being bent upwards to be above the top plane of the leadframe 100 including its die pad 110. The distal ends generally extend above the top plane of the leadframe 100 by a distance of 10 μm to 30 μm.

The leadframe 100 can comprise a leaded leadframe (such as a dual in-line package (DIP)) having a plurality of leads. Alternatively, the leadframe 100 can comprise a leadless leadframe, such as a quad flat no leads (e.g., QFN) leadframe having a plurality of lead terminals.

As described below, there is generally two punch forming steps in forming a disclosed leadframe 100 having cantilevers 111-114. The first punch forming step creates the cantilevers 111-114 with a free end 111b-114b, and the second punch forming step bends the free end 111b-114b of the cantilevers 111-114 to a position above the top plane of the leadframe 100 that enables an electronic component that is picked and placed on the die pad to push downwards on the free ends 111b-114b. The electronic component can comprise an IC die such as a silicon IC die, or an electronic laminate component (e.g., a laminate inductor, laminate transformer, or a laminate capacitor).

During assembly, electronic components can be placed by using a conventional pick and place machine, resulting in the distal end of the free end 111b-114b of the cantilevers 111-114 initially beginning from above the top plane of the leadframe 100 being pushed down by the electronic component to below the bottom plane, then elastically springing back so that the distal ends mechanically lock the electronic component in place, where the sloped outer edge portions act as a clip to mechanically hold the electronic component generally from all four sides. As described below, after this mechanical die attach, wire bonding follows to position bond wires between the die pads on the electronic component and leads or lead terminals of the leadframe, molding to form a mold compound, and then finally package singulation As noted above the electronic component can comprise a semiconductor IC die such as a silicon IC die. Although silicon is well-known to be a brittle material at room temperature, silicon is also known to become ductile above a critical temperature of about 700° C. Accordingly, to limit damage to the edges of the electronic component from the cantilever securing process, such as die edge chipping, in the case the electronic component comprises a silicon IC die, the silicon IC die may be heated to a temperature that is low enough to not cause significant damage to the IC die during the die placement, such as to about at least 350° C. or a temperature otherwise sufficient to render the silicon ductile enough to reduce cantilever induced damage to the edge of the IC die. It may also be possible to heat essentially only an edge of the IC die, such as using laser heating, that may permit localized heating of the edge of the IC die to a temperature higher than otherwise possible when there is temperature sensitive circuitry on the IC die, such as to a temperature of 500° C. to 700° C.

Figure 2:
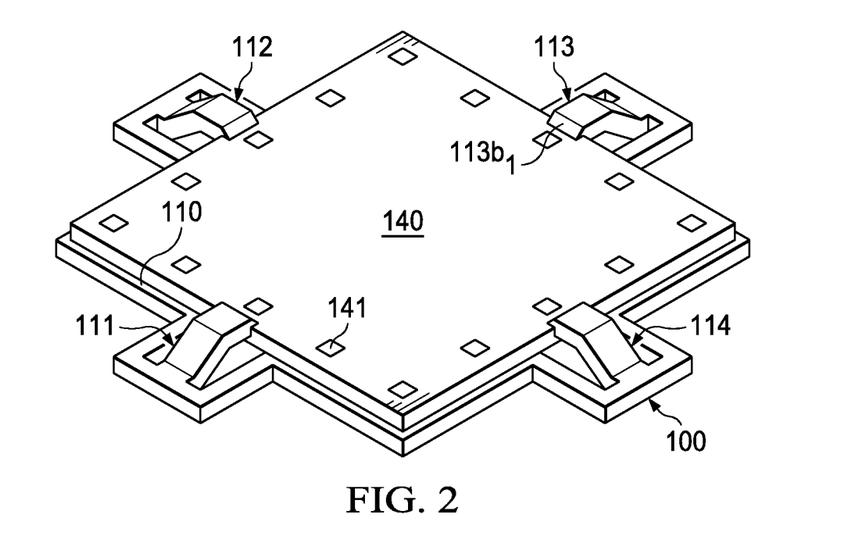
FIG. 2 is a top perspective view of an electronic component on a disclosed die pad that has cantilevers showing the electronic component locking feature on all four cantilevers holding the electronic component.

FIG. 2 is a top perspective view of an electronic component 140 having bond pads 141 on a disclosed die pad 110 having cantilevers 111-114. The electronic component locking feature on the distal end of all four cantilevers 111-114 can be seen to be holding the electronic component 140, shown with electronic component locking feature including a protruding sloped top portion $113b_1$ that is on the top surface of the electronic component 140.

Figure 3:
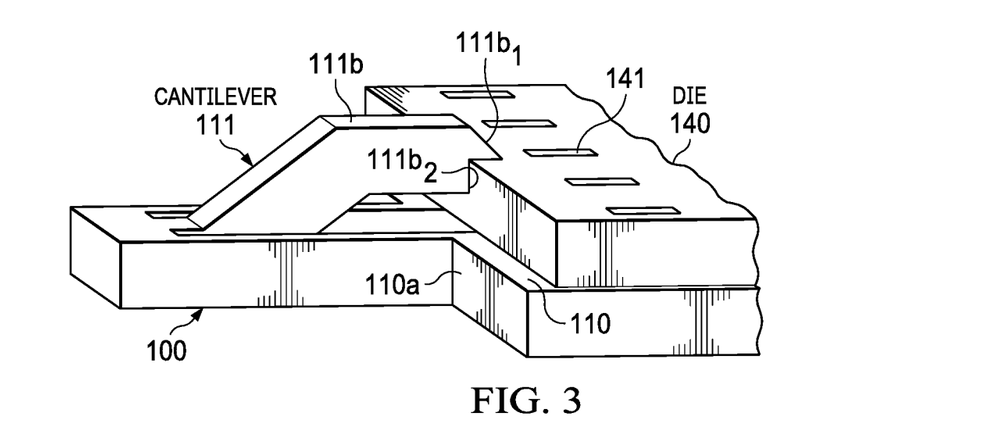
FIG. 3 is a side perspective view of an electronic component on a disclosed die pad that has cantilevers showing the electronic component locking feature of the cantilevers on one side of the die pad holding the electronic component.

FIG. 3 is a side perspective view of an electronic component 140 on a disclosed die pad 110 having cantilevers after placing the electronic component 140 on the die pad 110 showing cantilever 111 with the protruding sloped top portion $111b_1$ and lower portion $111b_2$ of the electronic component locking feature on one side of the die pad 110 holding the electronic component 140.

Disclosed leadframes can generally be used to form packaged semiconductor devices with essentially any electronic component which does not require its back side to be exposed from the package, so that the back side of the electronic component will generally be electrically floating. In addition, target applications for disclosed aspects are generally for those electronic components that do not need good adhesion between the back side of the electronic component and the die pad, so that some level of separation is considered acceptable.

A certain level of movement of the electronic component is expected inside the package since the height tolerance of the cantilever is expected to be around 10 µm and the electronic component thickness after backgrinding in the case of an IC die will generally vary by about 5 µm. Even if there is a gap between the back side of the electronic component and the die pad, as long as the electronic component locking feature of the cantilevers mechanically hold the electronic component, there should generally be no problem for wire bonding. Then even after assembly is completed, a gap between the bottom side of the electronic component and the die pad should generally not be a concern.

Figure 4:
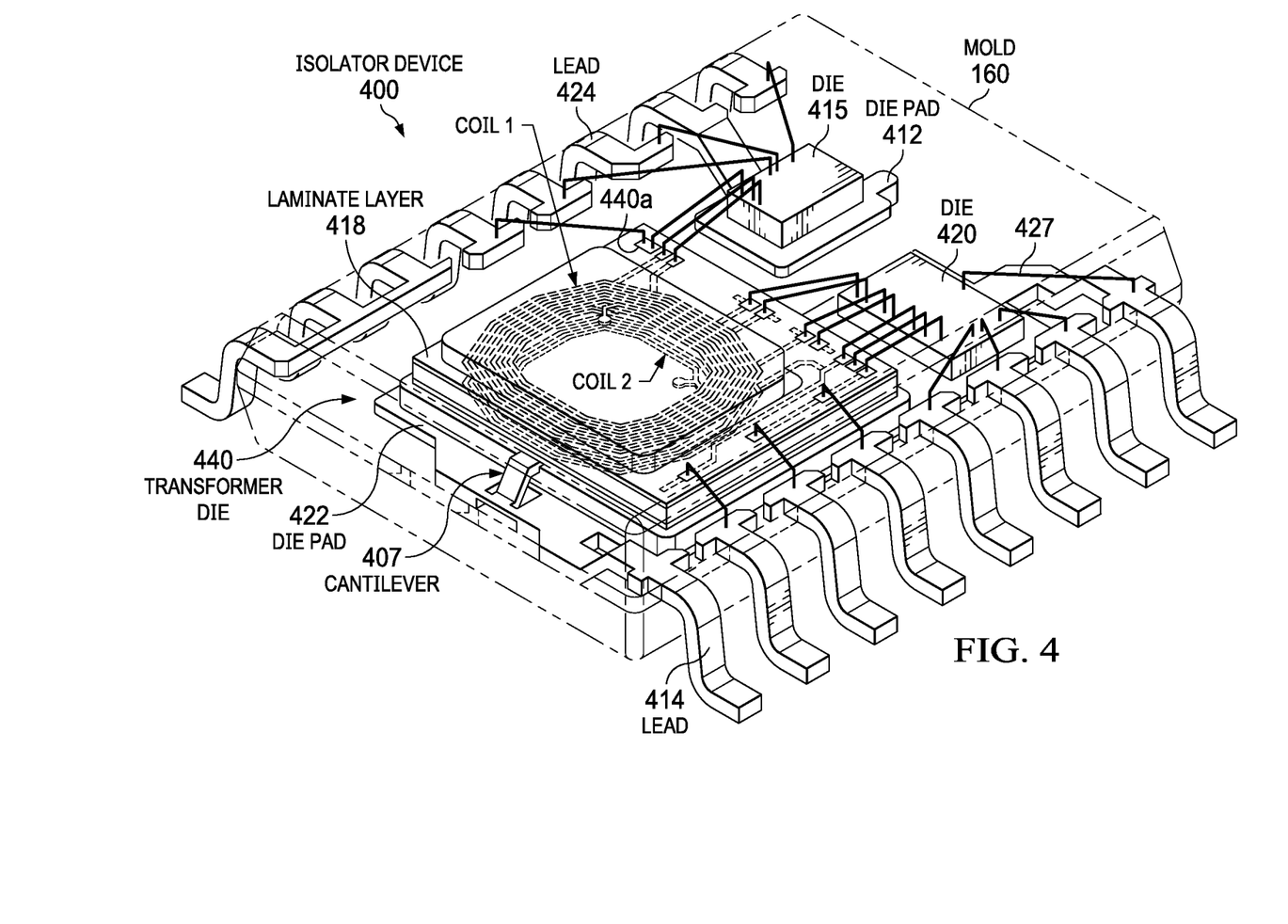
FIG. 4 depicts a packaged semiconductor device showing an isolation device having a magnetic enhanced laminate transformer, having an electronic component shown positioned top side up on a disclosed die pad that is secured by the electronic component locking features of the cantilevers to the die pad, with bond wires between bond pads on the electronic component to leads on at least two sides of the die pad, according to an example aspect.

FIG. 4 is a top perspective view of a packaged semiconductor device showing a digital isolator (digital ISO) device 400 having a magnetic enhanced laminate transformer 440 shown comprising a coil 1 and a coil 2 having a laminate layer 418 in between. The laminate transformer 440 is positioned top side up on a disclosed die pad mechanically secured to the die pad 422 by cantilevers including cantilever 407 on the side shown that secures coil 2 of the laminate transformer 440.

There are bond wires 427 between bond pads 440a on the laminate transformer 440 to leads (outer leads 414, 416) on at least two sides of the die pad 422. Although not shown, a stacked die device is also possible with the bottom electronic component being held by a die pad having disclosed cantilevers. As known in the art, a packaged ISO device such as digital ISO device 400 comprises a Tx circuit and an Rx circuit, with a high voltage capacitor or inductor in between these IC die which prevents the propagation of direct current (DC) and unwanted alternating current (AC) currents between its input on one IC die, and its output on the other IC die, while allowing the transmission of the desired AC signal.

The leadframe for the digital ISO device 400 includes outer leads 414 (on one side), 424 (on an opposite side), having 16 pins, 8 on each side. The digital ISO device 400 also included a die pad 412 with an IC die 415 thereon showing bond wires 427. Also, on the die pad 422 besides the laminate transformer 440 there is an IC die 420. There are also bond wires to the IC die 415 that is on the die pad 412. Mold for the package is shown as 160.

Figure 5A:
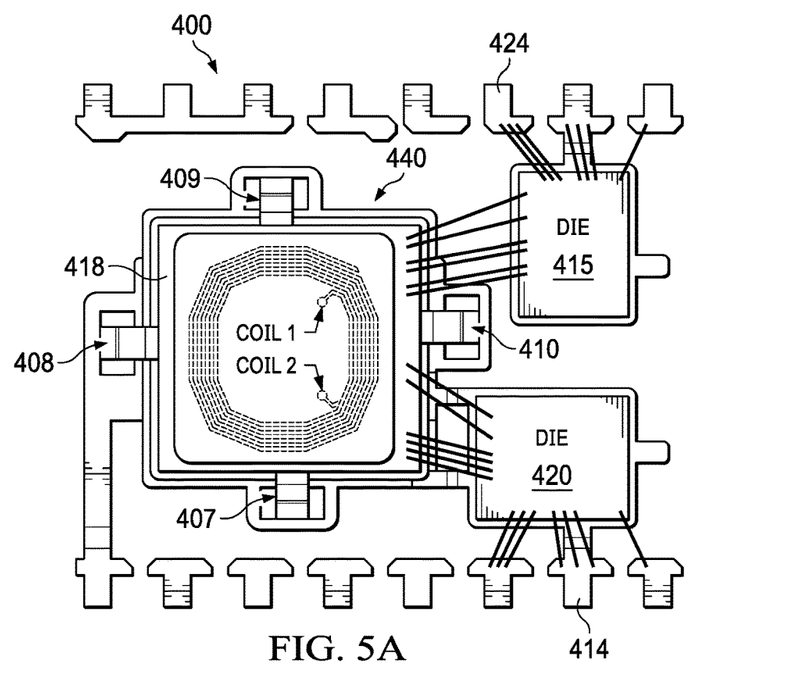
FIG. 5A is a top view of the packaged semiconductor device shown in FIG. 4 showing cantilevers on all four sides of the laminate transformer.
Figure 5B:
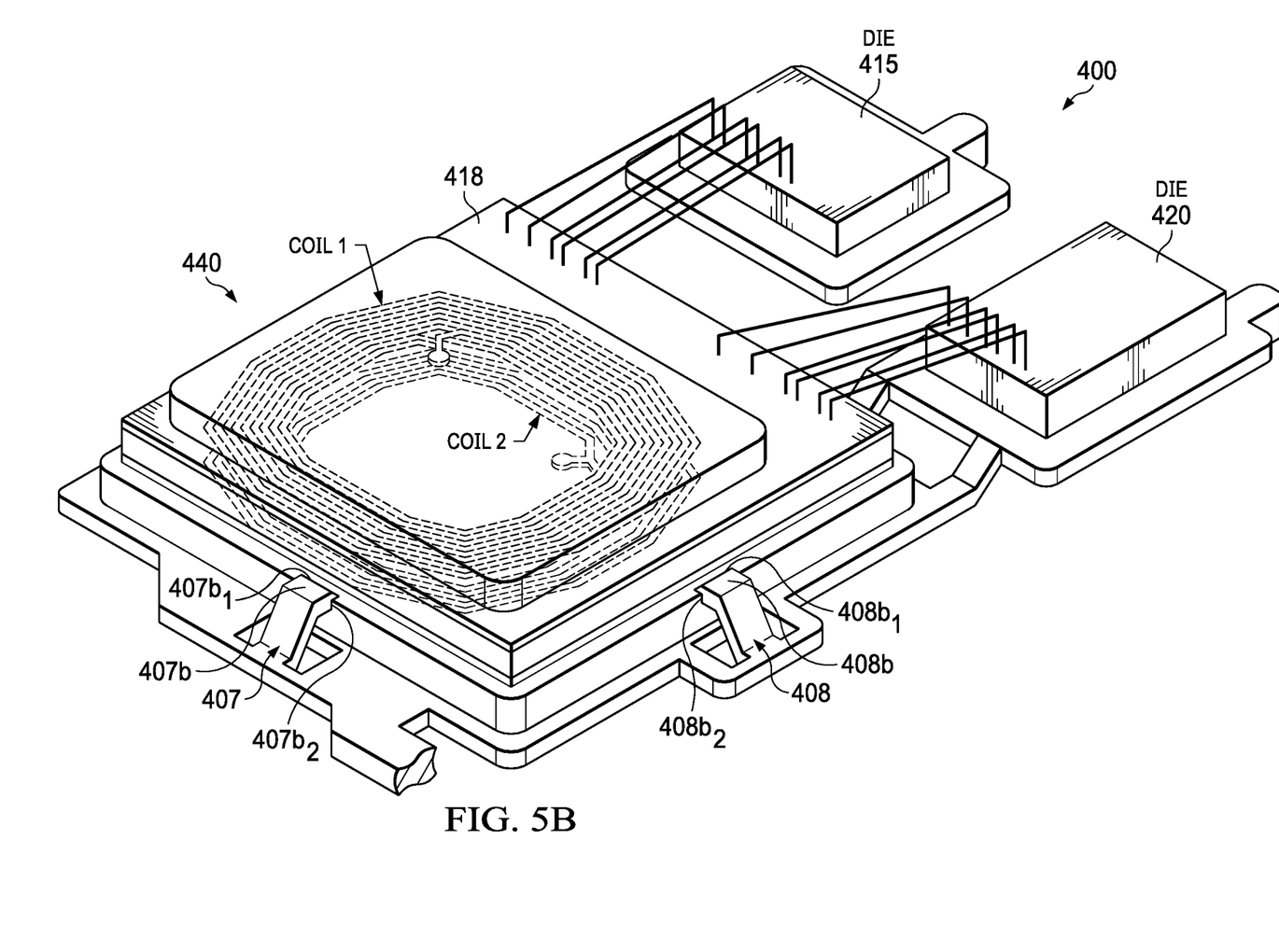
FIG. 5B is a perspective side view of the packaged semiconductor device shown in FIG. 4.
Figure 5C:
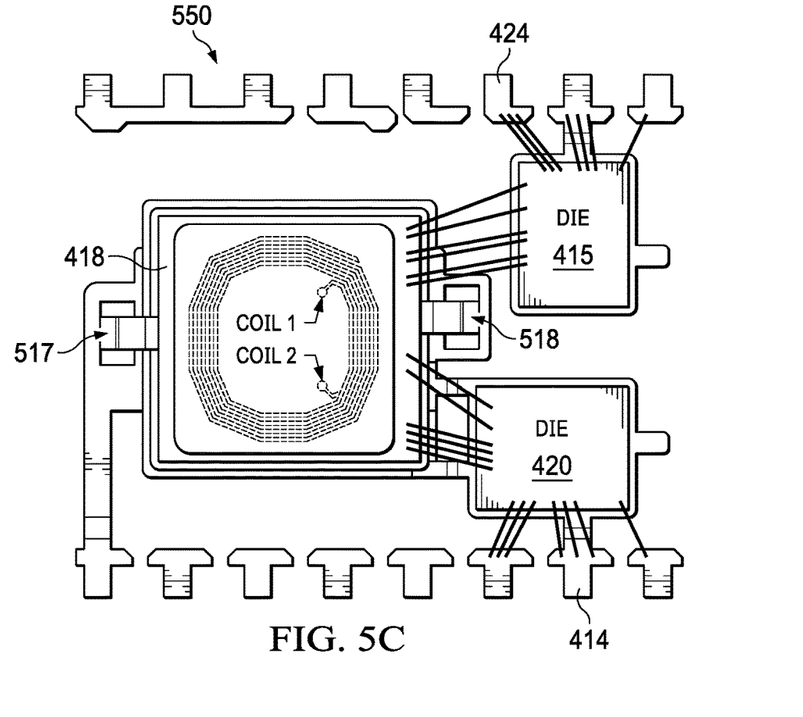
FIG. 5C is a top view of a packaged semiconductor device where the leadframe includes only two cantilevers.

FIG. 5A is a top view of the packaged semiconductor device 400 shown in FIG. 4 showing cantilevers 407, 408, 409 and 410 on all four sides of the laminate transformer 440. FIG. 5B is a side perspective view of the packaged semiconductor device 400 shown in FIG. 4. Cantilever 407 is shown including a free end 407b including a distal end providing protruding sloped top portion $407b_1$ and a lower portion $407b2$ indented relative to the top portion $407b_1$, and similarly cantilever 408 is shown including free end 408b including a distal end providing protruding sloped top portion $408b_1$ and a lower portion $408b2$ indented relative to the top portion $408b_1$. FIG. 5C is a top view of a packaged semiconductor device 550 where the leadframe includes only two cantilevers shown as 517 and 518.

Disclosed die pads having cantilevers including a distal end with an electronic component locking feature including a protruding sloped top portion and a lower portion indented relative to the top portion as noted above can be punch formed. The sloped edge of the top portion can be manufactured by a leadframe supplier, and punch forming can be used to push the distal end of cantilever upwards to above the top plane, in the same way outer leads are formed when performing a conventional trim form (TF) process. There can be two punch forming process, with the first punch forming step creating the cantilevers (with the free ends), and the second punch forming step bending the distal end of cantilever upwards so that it becomes positioned above the top plane of the leadframe. The non-planar ends can be formed by etching or stamping, and the process of punch forming can form the freed cantilever, follow by another punch forming step for bending the free end to position the free end above the top plane of the die pad.

Assembly steps generally comprise singulation of the electronic component when the electronic component comprises an IC die, comprising laser or saw singulation from a wafer including a plurality of IC die to provide a plurality of singulated IC die. The IC die are then mechanically bonded top side up to die pads of leadframes that are part of leadframe sheets (or leadframe panels), where the leadframes include die pads having cantilevers that have the distal end of the free ends of the cantilever raised up above the top plane of the die pad. The leadframes with cantilevers in the form of leadframe sheets (or panels) can be manufactured by leadframe supplier. The electronic component placement process results in the electronic component being secured by the cantilevers. Wire bonding, molding, and then package singulation follows.

For minimizing damage to the edge of the IC die or electronic laminate component, the design and the width, and length of the cantilever can be designed (e.g., with the aid of simulation, e.g., SOLIDWORK™ for simulation of the tolerance) for minimizing die damage at the edge of the electronic component. Furthermore, the electronic component may comprise an electronic laminate component that can provide more tolerance to edge damage because such electronic laminate components are generally tolerant to edge chipping as there is generally no functional circuitry near the edge of these components, so that some edge chipping may be acceptable.

Regarding the width for the cantilevers, the width range in one example can be at least 5% of the full width of the die pad, such as at least around 0.25 mm, up to the entire with of the die pad. Ideally, one cantilever design should be used for one electronic component size. As noted above electronic component thickness variation post backgrind in the case of an IC die is normally within 5 μm, so that a certain level of spacing between the back side of the electronic component and the die pad is expected.

Some level of coefficient of thermal expansion (CTE) mismatch between the material of the leadframe and the electronic component in the case of an IC die is expected. However, applied to packaged devices that do not provide contact to their back side, since they would generally be clamped during wire bonding, there should generally be no issue for the CTE mismatch between the material of the leadframe and electronic component during wire bonding.

Disclosed leadframes with a die pad having cantilevers that mechanically secure electronic components can be integrated into a variety of assembly flows to form a variety of different packaged semiconductor devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many variations of disclosed aspects are possible within the scope of the claimed invention, and further additions, deletions, substitutions and modifications may be made to the above-described aspects without departing from the scope of this Disclosure.

The invention claimed is:

1. A leadframe, comprising:
   a die pad having a plurality of sides which collectively define a rectangular die pad area including at least two securing sides, wherein the two securing sides each includes a linear portion with a cantilever interrupting the linear portion,
   wherein the die pad has a top surface defining a top plane and a bottom surface defining a bottom plane;
   lead terminals beyond the die pad;
   wherein the cantilevers have a fixed end and a free end opposite the fixed end that enables flexing or bending responsive to a received force;
   wherein the free ends include a distal end with an electronic component locking feature, and
   wherein the fixed ends are positioned beyond the rectangular die pad area and the electronic component locking feature extends inward over the rectangular die pad area for providing mechanical support and for securing an electronic component.

2. The leadframe of claim 1, wherein the electronic component locking feature includes a protruding sloped top portion and a lower portion indented relative to the top portion.

3. The leadframe of claim 1, wherein the distal ends extend above the top plane a distance of 10 μm to 30 μm.

4. The leadframe of claim 2, wherein the lower portion is planar and has a surface that is perpendicular to the top plane and to the bottom plane.

5. The leadframe of claim 1, wherein the fixed ends are positioned beyond the rectangular die pad area by a distance of 1 mm to 3 mm, and wherein the electronic component locking feature extends inward over the rectangular die pad area by a distance of 0.1 mm to 1 mm.

6. The leadframe of claim 1, wherein a width of the cantilever is at least 5% of a full width of the die pad.

7. A packaged semiconductor device, comprising:
   a leadframe, comprising:
   a die pad having a plurality of sides which collectively define a rectangular die pad area including at least two securing sides, wherein the two securing sides each includes a linear portion with a cantilever interrupting the linear portion,
   wherein the die pad has a top surface defining a top plane and a bottom surface defining a bottom plane;
   lead terminals beyond the die pad;
   wherein the cantilevers have a fixed end and a free end opposite the fixed end that enables flexing or bending responsive to a received force;
   wherein the free ends include a distal end with an electronic component locking feature;
   wherein the fixed ends are positioned beyond the rectangular die pad area and the electronic component locking feature extends inward over the rectangular die pad area for providing mechanical support and for securing an electronic component, and
   wherein the electronic component is on the die pad mechanically secured to the die pad by the cantilevers.

8. The packaged semiconductor device of claim 7, wherein the electronic component comprises a laminate capacitor, laminate inductor, or a laminate transformer.

9. The packaged semiconductor device of claim 7, wherein the electronic component comprises a semiconductor integrated circuit (IC) die.

10. The packaged semiconductor device of claim 7, wherein the electronic component locking feature includes a protruding sloped top portion and a lower portion indented relative to the top portion.

11. The packaged semiconductor device of claim 10, wherein the lower portion is planar and has a surface that is perpendicular to the top plane and to the bottom plane.

12. The packaged semiconductor device of claim 7, wherein the fixed ends are positioned beyond the rectangular die pad area by a distance of 1 mm to 3 mm, and wherein the electronic component locking feature extends inward over the rectangular die pad area by a distance of 0.1 mm to 1 mm.

13. The packaged semiconductor device of claim 7, wherein a width of the cantilever is at least 5% of a full width of the die pad.

14. A method forming a packaged semiconductor device, comprising:
providing a leadframe, comprising:
a die pad having a plurality of sides which collectively define a rectangular die pad area including at least two securing sides, wherein the two securing sides each includes a linear portion with a cantilever interrupting the linear portion,
wherein the die pad has a top surface defining a top plane and a bottom surface defining a bottom plane;
lead terminals beyond the die pad;
wherein the cantilevers have a fixed end and a free end opposite the fixed end that enables flexing or bending responsive to a received force;
wherein the free ends include a distal end with an electronic component locking feature, and
wherein the fixed ends are positioned beyond the rectangular die pad area and the electronic component locking feature extends inward over the rectangular die pad area for providing mechanical support and for securing an electronic component,
placing an electronic component having bond pads with its back side on the die pad, wherein the distal ends are pushed down by the electronic component to below the bottom plane, and then in response elastically move upwards to mechanically hold the electronic component from the two securing sides, and
wire bonding having bond pads to provide bond wires between the bond pads and the lead terminals.

15. The method of claim 14, wherein the electronic component locking feature includes a protruding sloped top portion and a lower portion indented relative to the top portion, and wherein the elastically move upwards is so that the protruding sloped top portions act as a clip to mechanically hold the top side of the electronic component from the two securing sides.

16. The method of claim 14, wherein the electronic component comprises a laminate inductor, a laminate transformer or a laminate capacitor.

17. The method of claim 14, wherein the cantilevers are on each of the plurality of sides.

18. The method of claim 14, wherein the free ends extend above the top plane a distance of 10 µm to 30 µm.

19. The method of claim 15, wherein the lower portion is planar and has a surface that is perpendicular to the top plane and to the bottom plane.

20. The method of claim 14, wherein the electronic component comprises a semiconductor integrated circuit (IC) die.

21. The method of claim 20, wherein the semiconductor IC die comprises a silicon IC die, further comprising heating the silicon IC die to a temperature of at least 350° C. before the placing.

* * * * *